(12) United States Patent
Lin et al.

(10) Patent No.: US 12,317,545 B2
(45) Date of Patent: May 27, 2025

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Yu-Chu Lin, Tainan (TW); Chi-Chung Jen, Kaohsiung (TW); Chia-Ming Pan, Tainan (TW); Su-Yu Yeh, Tainan (TW); Keng-Ying Liao, Tainan (TW); Chih-Wei Sung, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/358,264

(22) Filed: Jul. 25, 2023

(65) Prior Publication Data
US 2023/0369430 A1 Nov. 16, 2023

Related U.S. Application Data

(63) Continuation of application No. 17/698,748, filed on Mar. 18, 2022, now Pat. No. 11,804,529, which is a continuation of application No. 16/879,559, filed on May 20, 2020, now Pat. No. 11,282,931.

(60) Provisional application No. 62/881,270, filed on Jul. 31, 2019.

(51) Int. Cl.
| | |
|---|---|
| H10D 30/68 | (2025.01) |
| H10B 41/30 | (2023.01) |
| H10D 30/01 | (2025.01) |
| H10D 64/01 | (2025.01) |

(52) U.S. Cl.
CPC ......... *H10D 30/6892* (2025.01); *H10B 41/30* (2023.02); *H10D 30/0411* (2025.01); *H10D 30/681* (2025.01); *H10D 64/035* (2025.01)

(58) Field of Classification Search
CPC .......... H10D 30/6892; H01L 29/42328; H01L 29/40114; H01L 41/30
See application file for complete search history.

(56) References Cited

U.S. PATENT DOCUMENTS

| | | | | |
|---|---|---|---|---|
| 4,113,533 | A * | 9/1978 | Okumura | H01L 21/033 438/301 |
| 6,747,310 | B2 * | 6/2004 | Fan | H01L 29/42328 257/E27.103 |
| 2012/0261736 | A1 | 10/2012 | Hsu | |
| 2014/0008714 | A1 | 1/2014 | Makala et al. | |

(Continued)

*Primary Examiner* — Errol V Fernandes
(74) *Attorney, Agent, or Firm* — Maschoff Brennan

(57) ABSTRACT

A method includes sequentially depositing a floating gate layer, a dielectric structure stack, and a control gate layer over a substrate. A first etching process is performed to pattern the control gate layer, the dielectric structure stack, and a top portion of the floating gate layer to form a control gate, a dielectric structure, and a top portion of a floating gate over a bottom portion of the floating gate layer. A sidewall of the top portion of the floating gate is concave. A first spacer structure is formed on the sidewall of the top portion of the floating gate, a sidewall of the dielectric structure, and a sidewall of the control gate. A second etching process is performed to pattern the bottom portion of the floating gate layer to form a bottom portion of the floating gate after forming the first spacer structure.

20 Claims, 17 Drawing Sheets

(56) References Cited

U.S. PATENT DOCUMENTS

| | | |
|---|---|---|
| 2015/0333173 A1 | 11/2015 | Wu et al. |
| 2015/0364558 A1 | 12/2015 | Wu et al. |
| 2016/0336415 A1 | 11/2016 | Wu |
| 2020/0105935 A1* | 4/2020 | Yeong ............... H01L 21/76897 |

* cited by examiner

MEMORY DEVICE AND MANUFACTURING METHOD THEREOF

PRIORITY CLAIM AND CROSS-REFERENCE

This application is a continuation application of U.S. patent application Ser. No. 17/698,748, filed Mar. 18, 2022, which is a continuation application of U.S. patent application Ser. No. 16/879,559, filed May 20, 2020, now U.S. Pat. No. 11,282,931, issued on Mar. 22, 2022, which claims priority to U.S. Provisional Application Ser. No. 62/881,270, filed Jul. 31, 2019, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
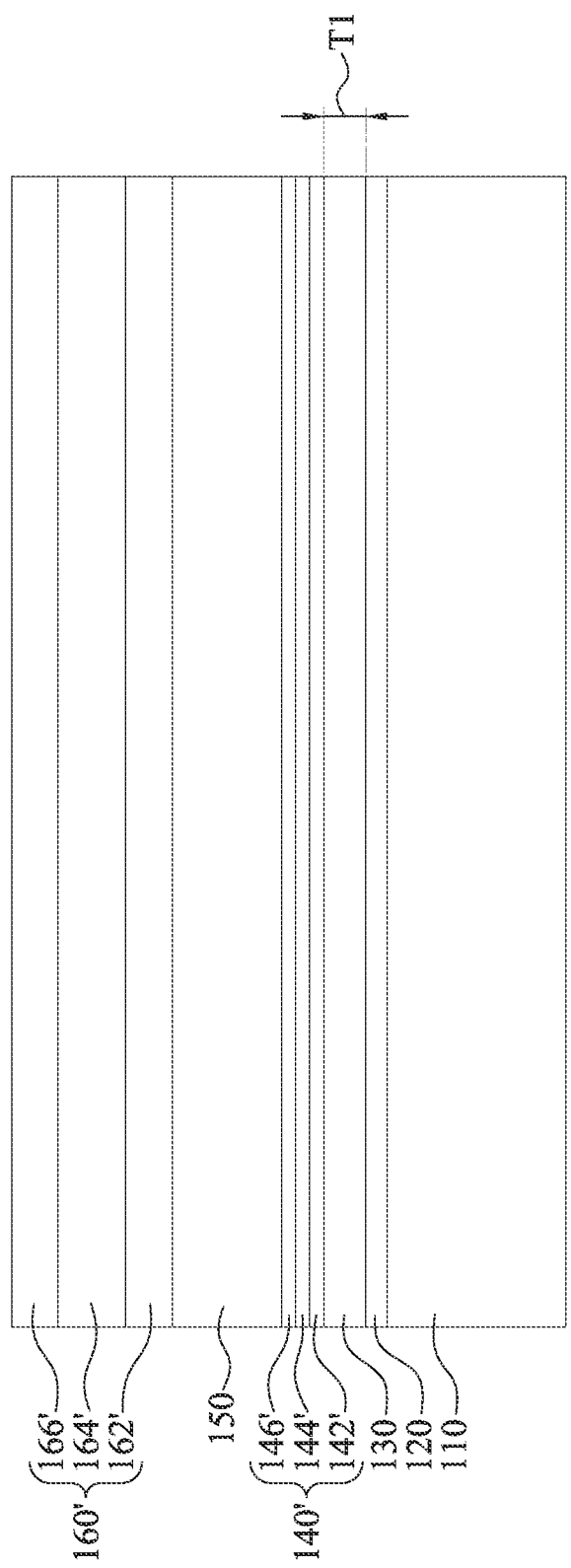
FIGS. 1 to 15 illustrate a method for manufacturing a memory device in different stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Some embodiments of the present disclosure relate to flash memory devices having a floating gate with a concave sidewall. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

FIGS. 1 to 15 illustrate a method for manufacturing a memory device in different stages in accordance with some embodiments. Reference is made to FIG. 1. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure.

A gate dielectric film 120 is then formed over the substrate 110. In some embodiments, the gate dielectric film 120 may include, for example, a dielectric material such as silicon dioxide ($SiO_2$), silicon nitride ($Si_3N_4$), oxynitrides (SiON), high-k materials, other non-conductive materials, or combinations thereof. The gate dielectric film 120 may be formed using thermal oxide, chemical vapor deposition (CVD), physical vapor deposition (PVD), atomic layer deposition (ALD), ozone oxidation, other suitable processes, or combinations thereof.

Then, a floating gate layer 130 is conformally formed over the gate dielectric film 120. The floating gate layer 130 may include polysilicon formed through, for example low pressure CVD (LPCVD) methods, CVD methods and PVD sputtering methods employing suitable silicon source materials. If desired, the floating gate layer 130 may be ion implanted to the desired conductive type. It is to be appreciated other gate electrode material such as metal, metal alloys, single crystalline silicon, or combinations thereof. In some embodiments, the floating gate layer 130 has a thickness T1 in a range of about 900 nm to about 2000 nm. If the thickness T1 is greater than about 2000 nm, the surface topography performance of the following formed floating gate 135 (see FIG. 15) may be lowered; if the thickness T1 is less than about 900 nm, the electrical performance of the floating gate layer 130 may be low.

Subsequently, a dielectric structure 140' is formed over the floating gate layer 130. The dielectric structure 140' may include, for example, a dielectric material such as silicon dioxide ($SiO_2$), silicon nitride ($Si_3N_4$), oxynitrides (SiON), high-k materials, other non-conductive materials, or combinations thereof. In some embodiments, the dielectric structure 140' includes a bottom layer 142', a middle layer 144', and a top layer 146'. The middle layer 144' is above the bottom layer 142', and the top layer 146' is above the middle layer 144'. In some embodiments, the middle layer 144' is in contact with the bottom layer 142' and the top layer 146'. The bottom layer 142' and the top layer 146' may be oxide layers, and the middle layer 144' may be a nitride layer. For example, the bottom layer 142' and the top layer 146' may be made of silicon dioxide ($SiO_2$) and the middle layer 144' may be made of silicon nitride. The dielectric structure 140' may be formed using chemical vapor deposition (CVD), physical vapor deposition (PVD), atomic layer deposition (ALD), ozone oxidation, other suitable processes, or combinations thereof.

Then, a control gate layer 150 is formed over the dielectric structure 140'. The control gate layer 150 may include polysilicon formed through, for example low pressure CVD (LPCVD) methods, CVD methods and PVD sputtering methods employing suitable silicon source materials. If desired, the control gate layer 150 may be ion implanted to the desired conductive type. It is to be appreciated other gate electrode material such as metal, metal alloys, single crystalline silicon, or combinations thereof. In some embodiments, the thickness of the control gate layer 150 is greater than the thickness T1 of the floating gate layer 130.

Next, a hard mask structure 160' is formed over the control gate layer 150. The hard mask structure 160' may include, for example, a dielectric material such as silicon dioxide ($SiO_2$), silicon nitride ($Si_3N_4$), oxynitrides (SiON), high-k materials, other non-conductive materials, or combinations thereof. In some embodiments, the hard mask structure 160' includes a bottom layer 162', a middle layer 164', and a top layer 166'. The middle layer 164' is above the bottom layer 162', and the top layer 166' is above the middle layer 164'. In some embodiments, the middle layer 164' is in contact with the bottom layer 162' and the top layer 166'. The bottom layer 162' and the top layer 166' may be oxide layers, and the middle layer 164' may be a nitride layer. For example, the bottom layer 162' and the top layer 166' may be made of silicon dioxide ($SiO_2$) and the middle layer 164' may be made of silicon nitride. The hard mask structure 160' may be formed using chemical vapor deposition (CVD), physical vapor deposition (PVD), atomic layer deposition (ALD), ozone oxidation, other suitable processes, or combinations thereof.

Figure 2:
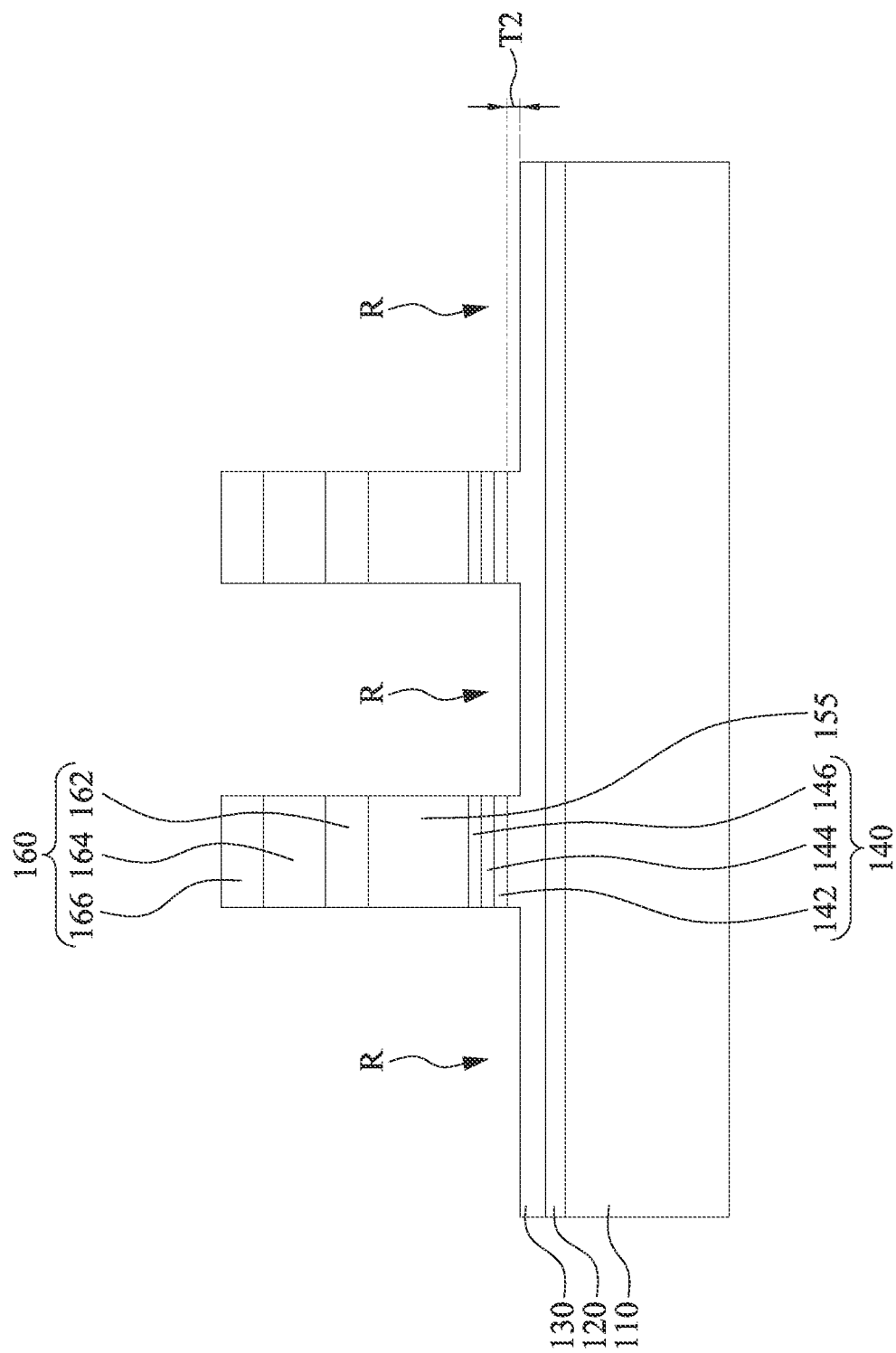

Reference is made to FIG. 2. The hard mask structure 160', the control gate layer 150, and the dielectric structure 140' of FIG. 1 are patterned to be dielectric structures 140, control gates 155, and hard mask structures 160. The dielectric structures 140 are formed over the floating gate layer 130, the control gates 155 are respectively formed over the dielectric structures 140, and the hard mask structures 160 are respectively formed over the control gates 155. Further, a plurality of recesses R are formed in the floating gate layer 130. In some embodiments, the recess R has a depth T2 in a range between about 850 nm and about 1950 nm. In some embodiments, each of the dielectric structures 140 includes a bottom layer 142, a middle layer 144, and a top layer 146, and each of the hard mask structures 160 includes a bottom layer 162, a middle layer 164, and a top layer 166.

Figure 3:
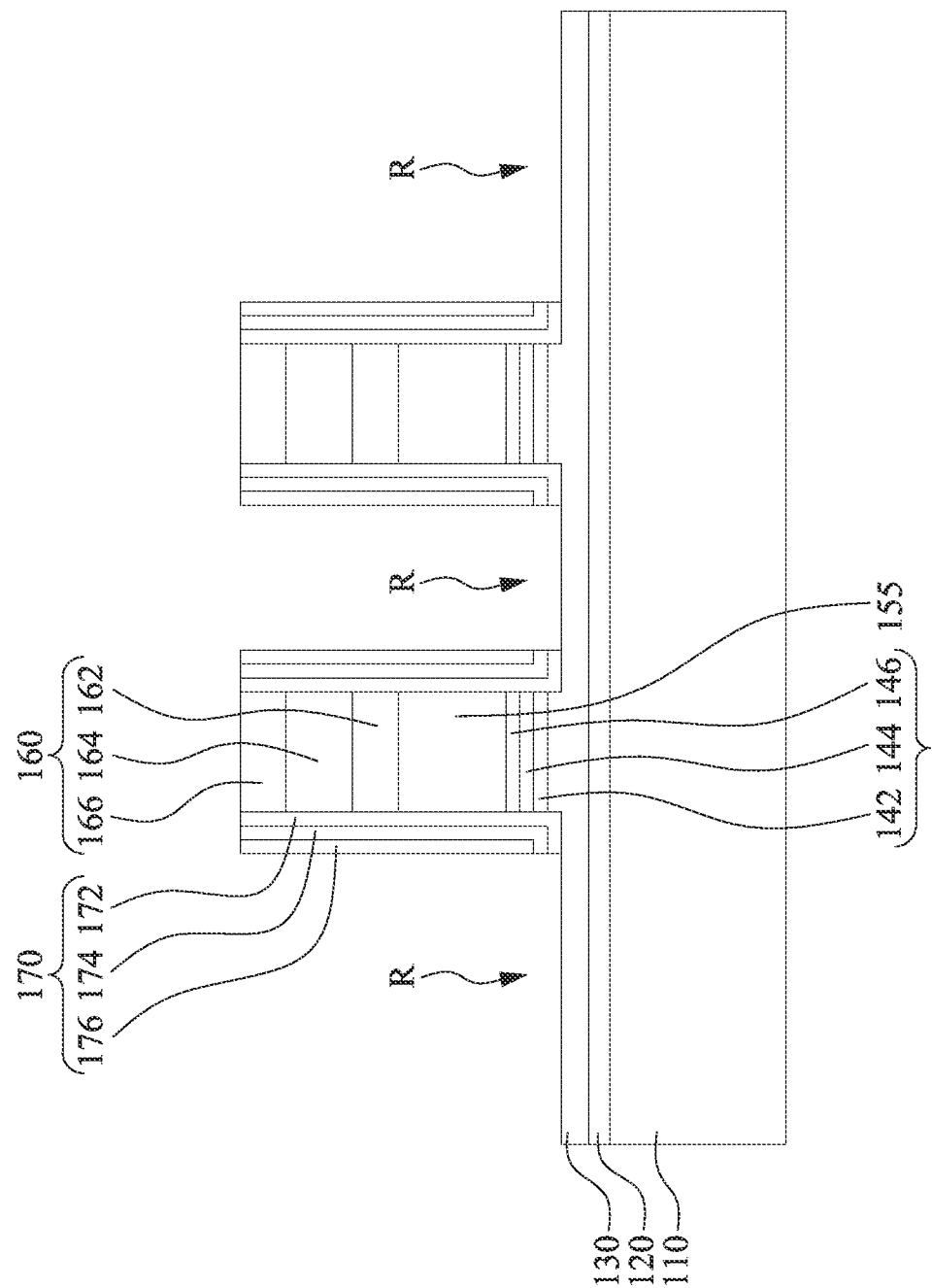

Reference is made to FIG. 3. Control-gate spacer structures 170 are formed on sidewalls of the dielectric structures 140, control gates 155, and hard mask structures 160. The control-gate spacer structures 170 are further formed in the recesses R and thus in contact with the floating gate layer 130. In some embodiments, each of the control-gate spacer structures 170 includes an inner layer 172, a middle layer 174, and an outer layer 176. The inner layer 172 and the outer layer 176 may be oxide layers (e.g., $SiO_2$), and the middle layer 174 may be a nitride layer (e.g., $Si_3O_4$). The middle layer 174 is in contact with the inner layer 172 and the outer layer 176, and the inner layer 172 is in contact with the floating gate layer 130, the dielectric structure 140, the control gate 155, and the dielectric structure 160. The control-gate spacer structures 170 may be formed using a deposition method, such as plasma enhanced chemical vapor deposition (PECVD), low-pressure chemical vapor deposition (LPCVD), sub-atmospheric chemical vapor deposition (SACVD), or the like. The formation of the control-gate spacer structures 170 may include blanket forming spacer layers and then performing etching operations to remove the horizontal portions of the spacer layers. The remaining vertical portions of the spacer layers form the control-gate spacer structures 170.

Figure 4:
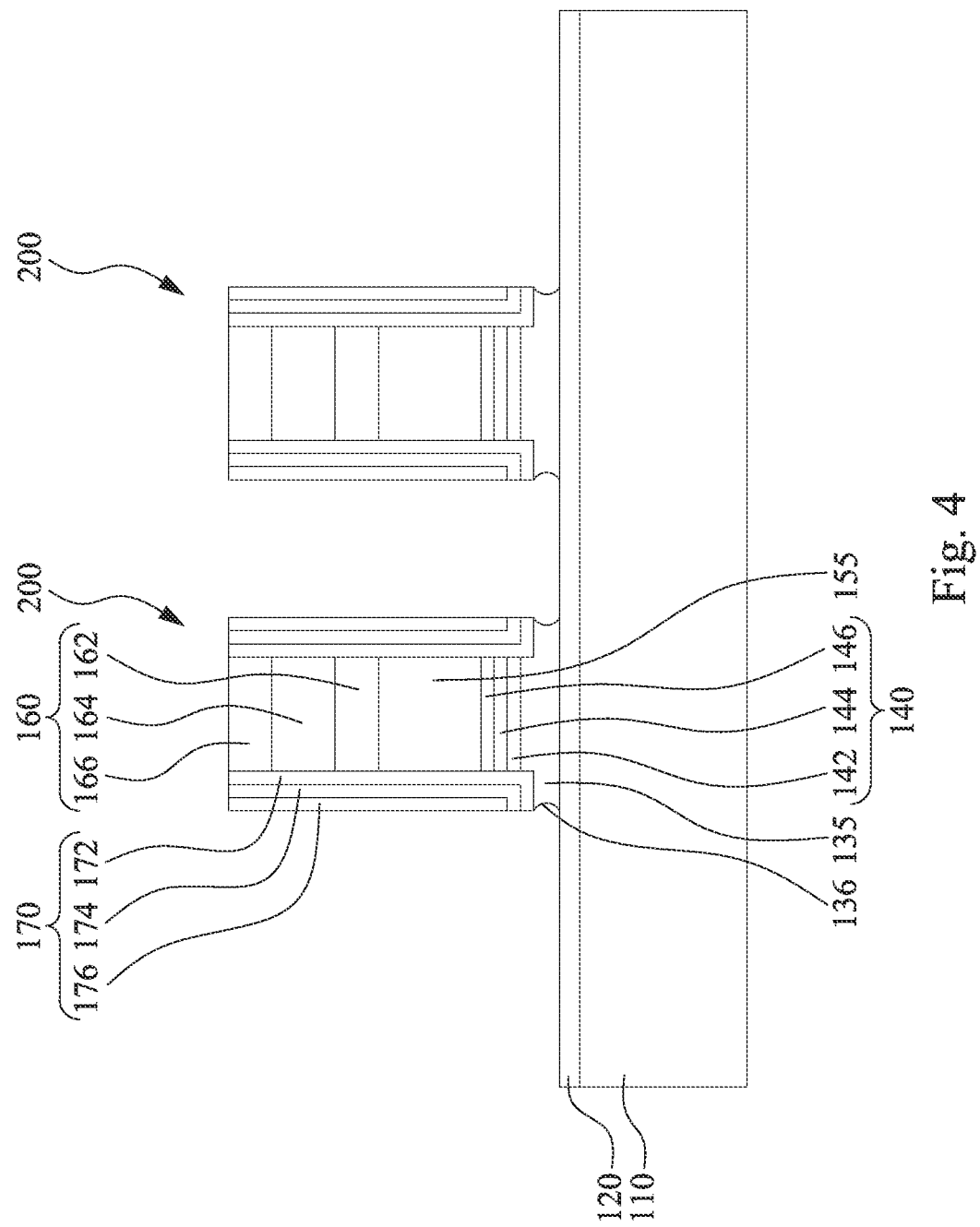

Reference is made to FIG. 4. The floating gate layer 130 in FIG. 3 is further patterned to form floating gates 135 respectively under the control gates 155. The etching of the floating gate layer 130 results in floating gates 135 to be separated from each other, wherein each of the floating gates 135 may be used for forming one flash memory cell 10 (see FIG. 14). The etching of the floating gates 135 may be anisotropic, and may be stopped on the gate dielectric film 120 in some embodiments. Anisotropic etching means different etch rates in different directions in the material. That is, an anisotropic etching removes the material being etched at different rates in different directions. The control-gate spacer structures 170 thus overlap the edge portions of the floating gates 135. Furthermore, the etching of floating gates 135 may be a blanket etching without using a lithography mask. In FIG. 4, the floating gate 135, the dielectric structure 140, the control gate 155, the dielectric structure 160, and the spacer structure 170 are together referred to as a gate stack 200. Further, each of the floating gates 135 includes curved sidewalls 136.

In some embodiments, the floating gate layer 130 is made of polysilicon, and the etching process includes a dry etching process that utilizes a gas including CHxFy (where x is in a range of 1 to 8 and y=4−x) or other suitable gas. If x and y values are out of these ranges, the etching process won't form floating gate with curved sidewalls as shown in FIG. 4. In some embodiments, the dry etching process is tuned to selectively etching the floating gate layer 130 while the control-gate spacer structures remains. In some embodiments, the dry etching process utilizes a pressure ranging from about 100 mT to about 120 mT, a power ranging from about 600 W to about 800 W, a bias voltage ranging from about 40 V to about 60 V, and a CHxFy flow rate ranging from about 20 sccm to about 60 sccm.

Figure 5:
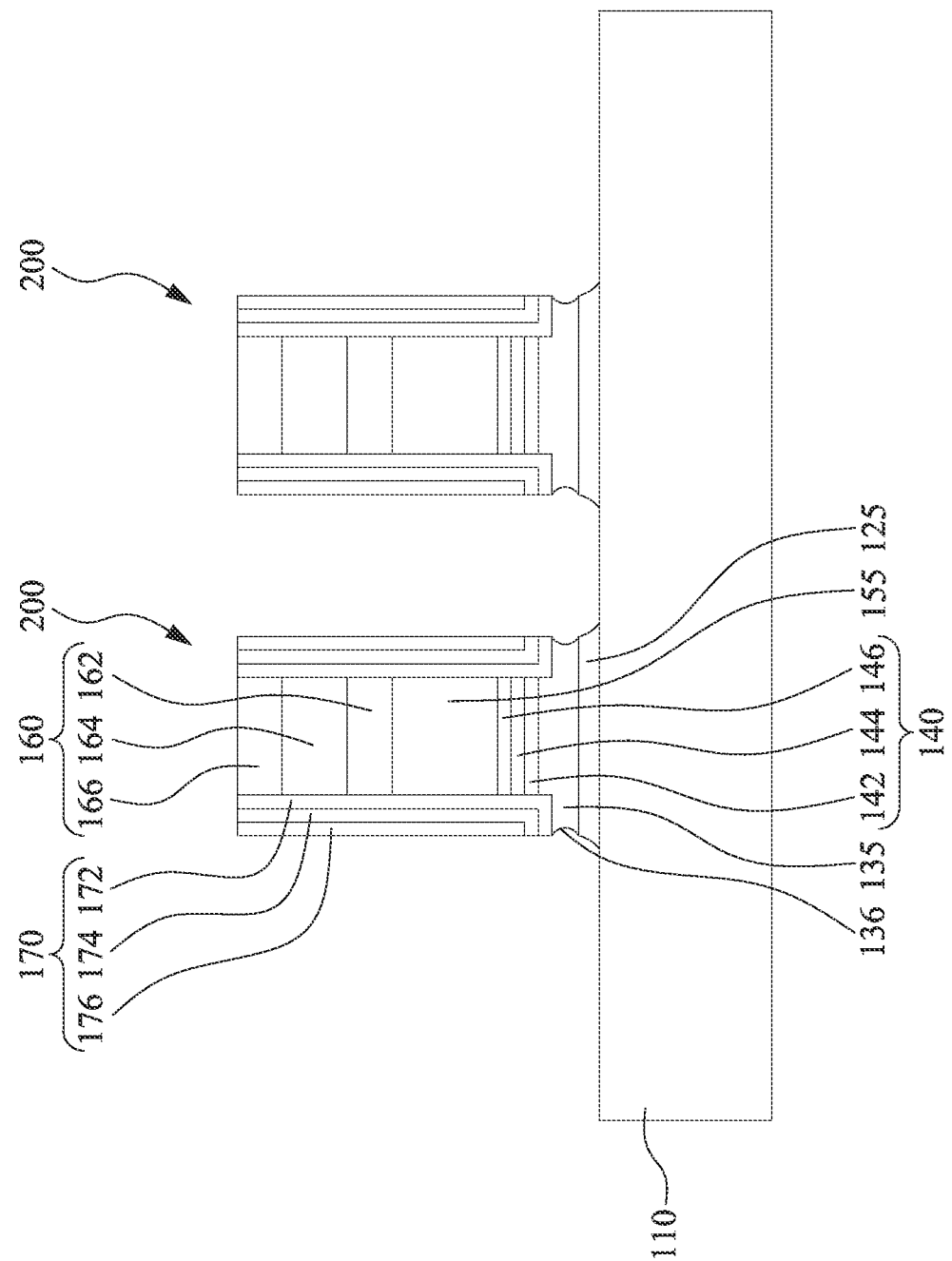

Reference is made to FIG. 5. The gate dielectric film 120 in FIG. 4 is patterned using the gate stacks 200 as masks to form gate dielectric layers 125 respectively under the gate stacks 200. In some embodiments, edges of the gate dielectric layers 125 are aligned with the sidewalls 136 of the floating gates 135. The etching of the gate dielectric film 120 may be anisotropic, and may be stopped on the substrate 110 in some embodiments.

Figure 6:
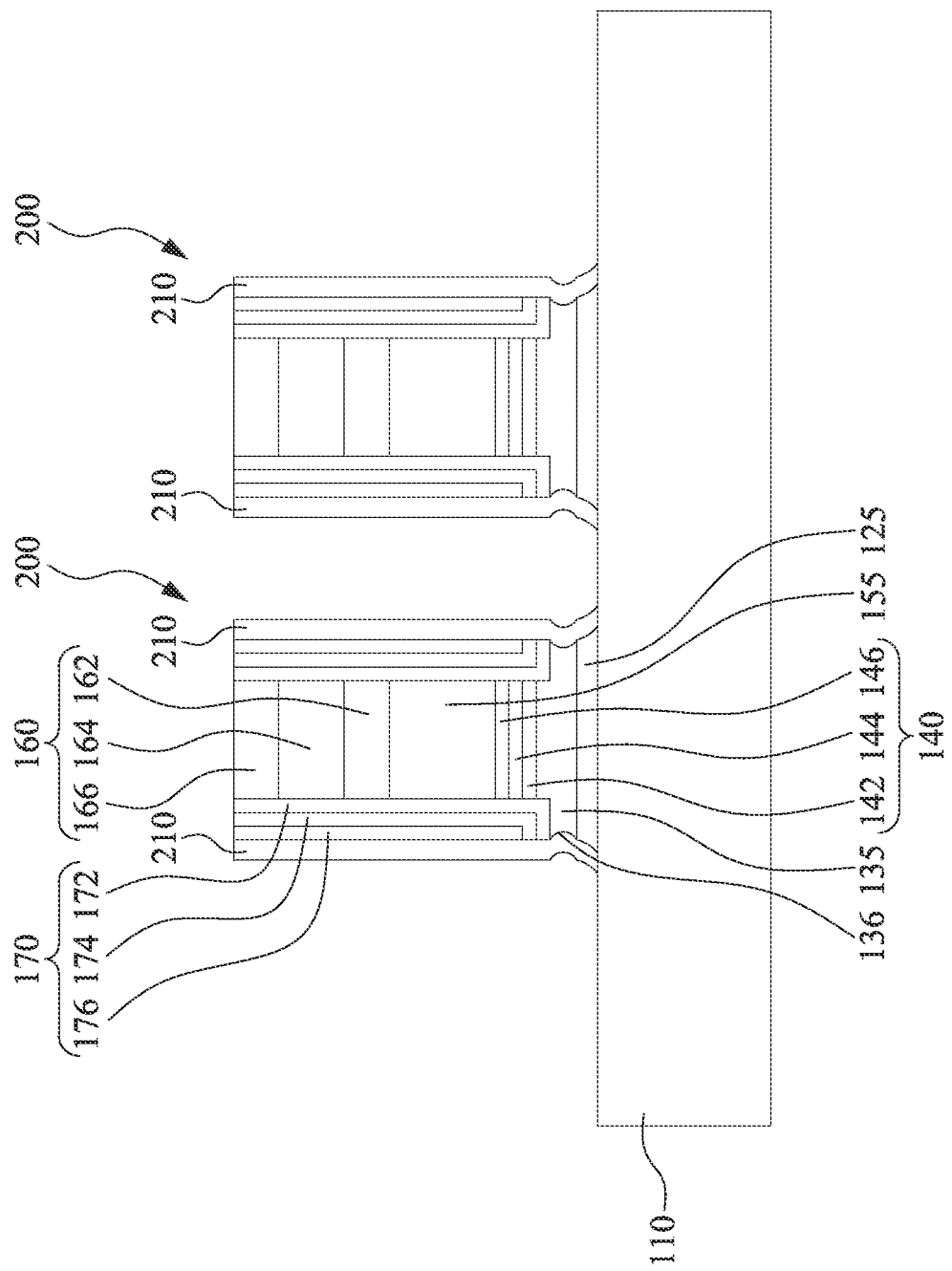

Reference is made to FIG. 6. Floating-gate spacer structures 210 are formed on opposite sides of the gate stacks 200. In some embodiments, the floating-gate spacer structures 210 are high temperature oxide layer or other suitable dielectric layers. In some embodiments, a dielectric film may be conformally formed over the structure of FIG. 5, and an etching process is performed to remove the horizontal portions of the dielectric film to form the dielectric layers 210. In FIG. 6, since the floating gate 135 has curved (e.g., concave) sidewalls, bottom portions of the floating-gate spacer structures 210 are curved toward the floating gate 135. In some embodiments, the floating-gate spacer structures 210 may be multiple layers, e.g., oxide-nitride-oxide stacking layers.

Figure 7:
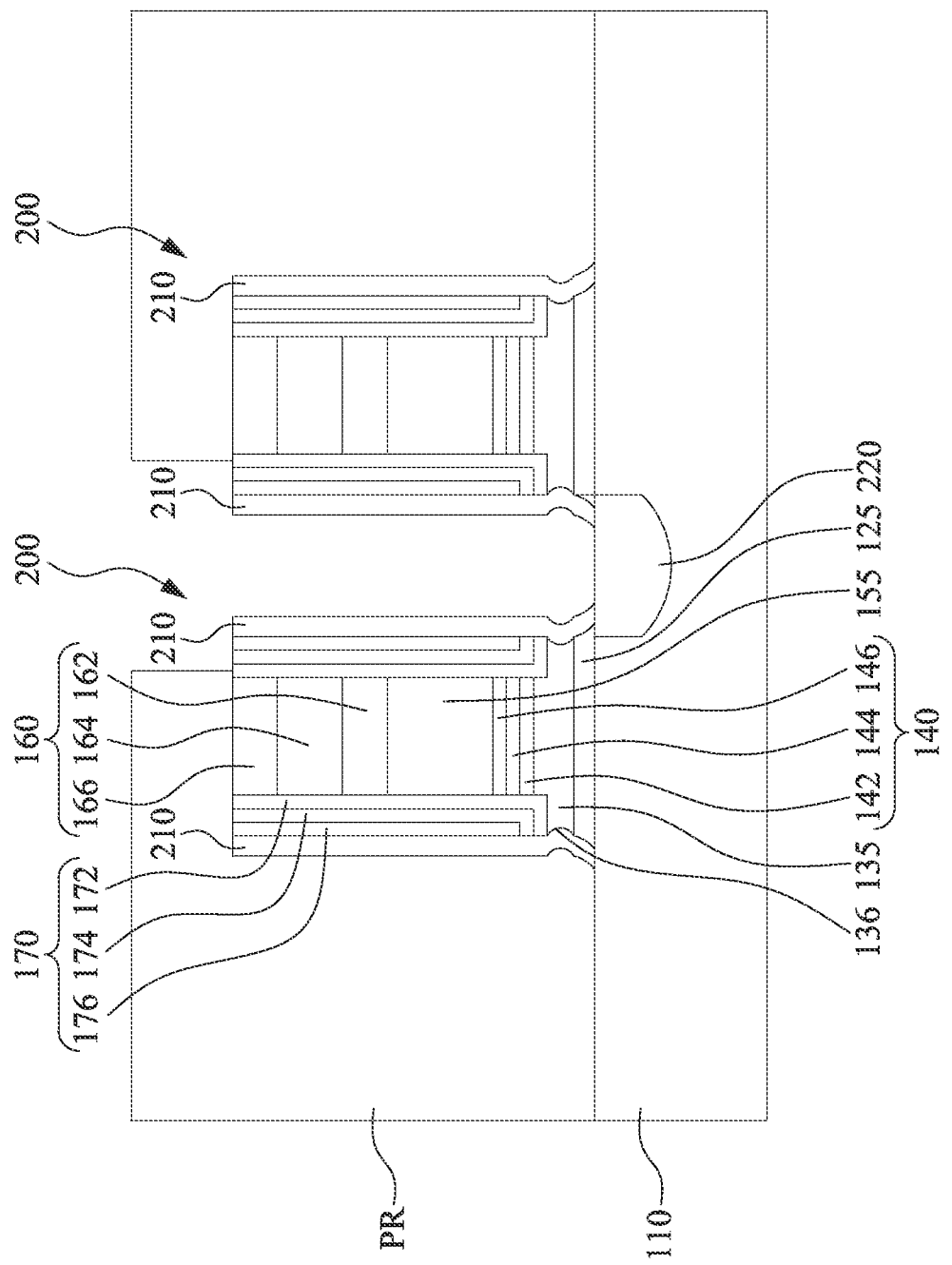

Reference is made to FIG. 7. At least one common source region 220 is formed between two adjacent gate stacks 200. For example, a patterned photoresist layer PR is formed by a combination of spin coating, exposing and developing processes to expose areas of the substrate 110 between adjacent gate stacks 200. The patterned photoresist layer PR may be formed by a photolithography process. Some exemplary photolithography processes may include processing operations of photoresist coating, soft baking, mask aligning, exposing, post-exposure baking, developing photoresist, and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer may be formed prior to forming the patterned photoresist layer PR.

Subsequently, an implantation is performed using the patterned photoresist layer PR as an implantation mask, so that the common source region 220 is formed in substrate 110. The common source region 220 is shared by two memory cells 10 (see FIG. 14). In some embodiments, the common source region 220 is a heavily doped n-type region, which may have an n-type impurity higher than about $10^{19}/cm^3$, for example.

Figure 8:
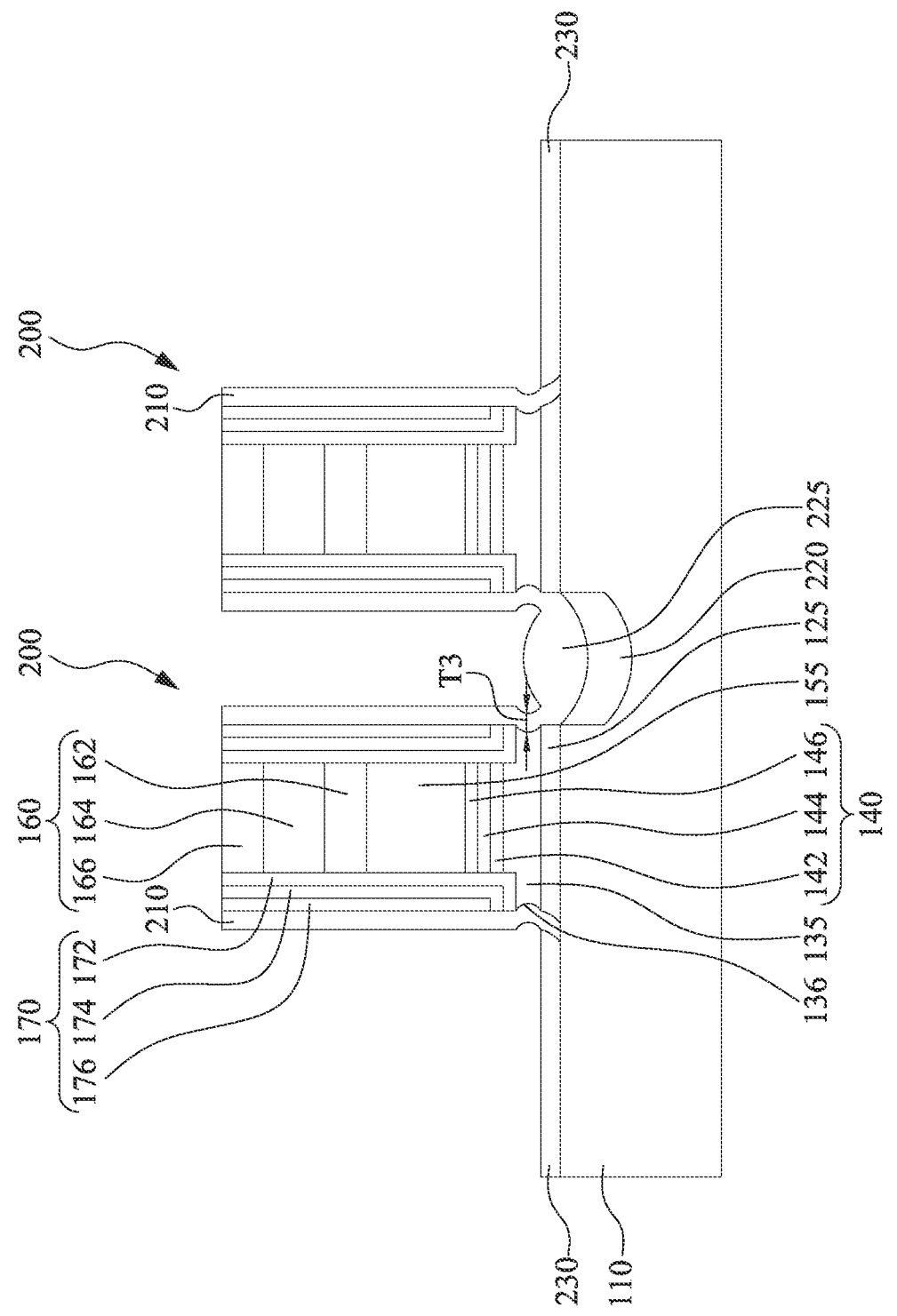

Reference is made to FIG. 8. The floating-gate spacer structures 210 between adjacent two gate stacks 200 (above the common source region 220) are removed. Then, a common source (CS) dielectric layer 225 is formed over the common source region 220. The CS dielectric layer 225 may be a dielectric isolation structure and may be formed by oxidizing the substrate 110, other suitable processes, or combinations thereof. In some other embodiments, the CS dielectric layer 225 may be a multiple layer, e.g., oxide-nitride-oxide layers. The patterned photoresist layer PR (see FIG. 7) is then removed, and the removal method may be performed by solvent stripping or plasma ashing, for example. In some embodiments, select-gate dielectric layers 230 are formed by oxidizing the substrate 110, such that the select-gate dielectric layers 230 may be oxide layers. In FIG. 8, since the floating gate 135 has concave sidewalls, bottom portions of the CS dielectric layer 225 in contact with the floating gate 135 are curved toward the floating gate 135. In some embodiments, a thickness T3 of the bottom portion of the CS dielectric layer 225 is in a range of about 80 nm to about 95 nm. If the thickness T3 is less than 80 nm, the following formed memory cell may have a data retention issue.

Figure 9:
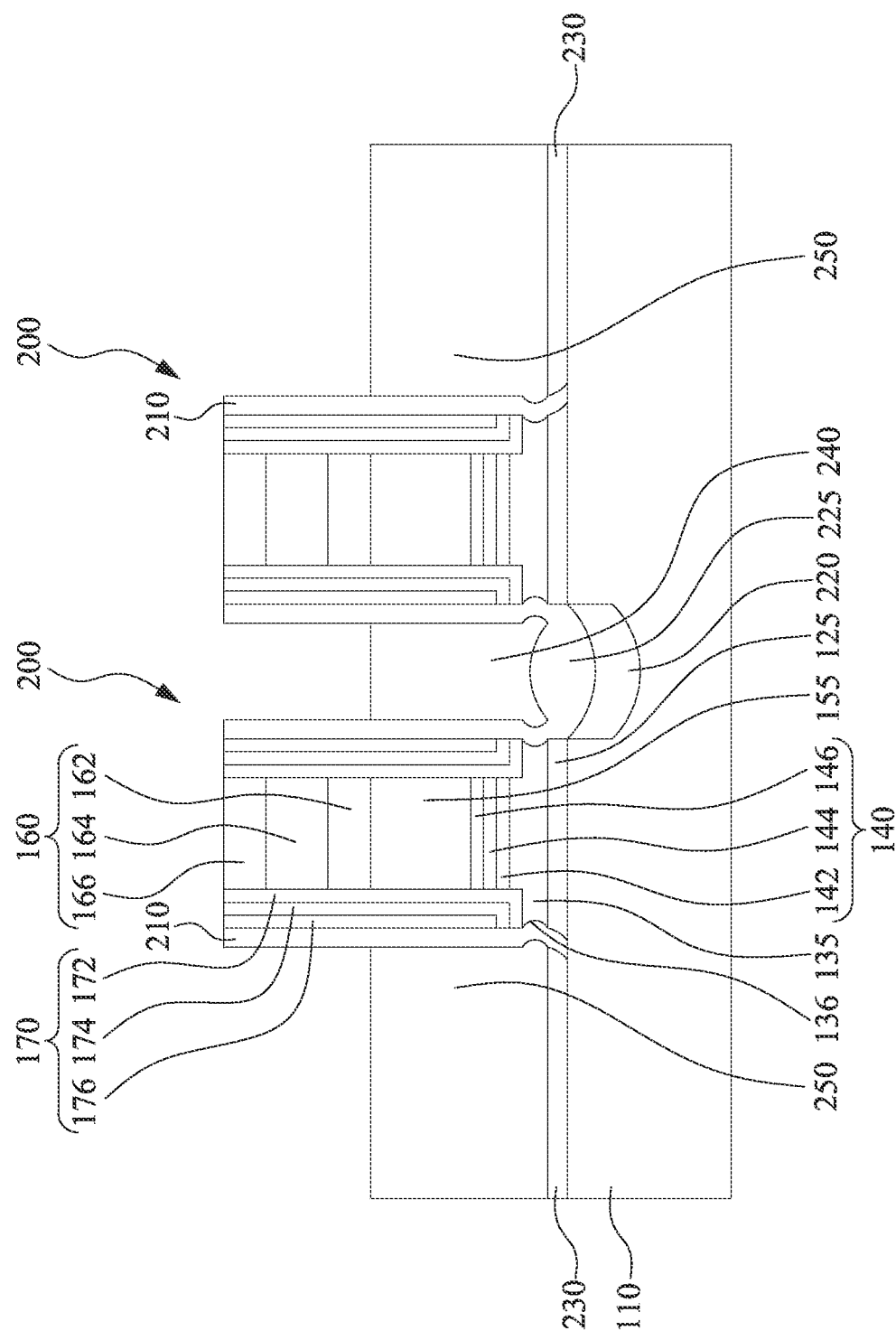

Reference is made to FIG. 9. A plurality of erase gates 240 and select gates (or word lines) 250 are respectively formed on opposite sides of the gate stacks 200. For example, a conductive layer is deposited over the substrate 110, and the conductive layer is patterned or etched back. In some embodiments, top surfaces of the erase gates 240 and the select gates 250 are substantially coplanar with the control gates 155. The erase gates 240 and the select gates 250 may include polysilicon formed through, for example low pressure CVD (LPCVD) methods, CVD methods and PVD sputtering methods employing suitable silicon source materials. If desired, the erase gates 240 and the select gates 250 may be ion implanted to the desired conductive type. It is to be appreciated other gate electrode material such as metal, metal alloys, single crystalline silicon, or combinations thereof.

Figure 10:
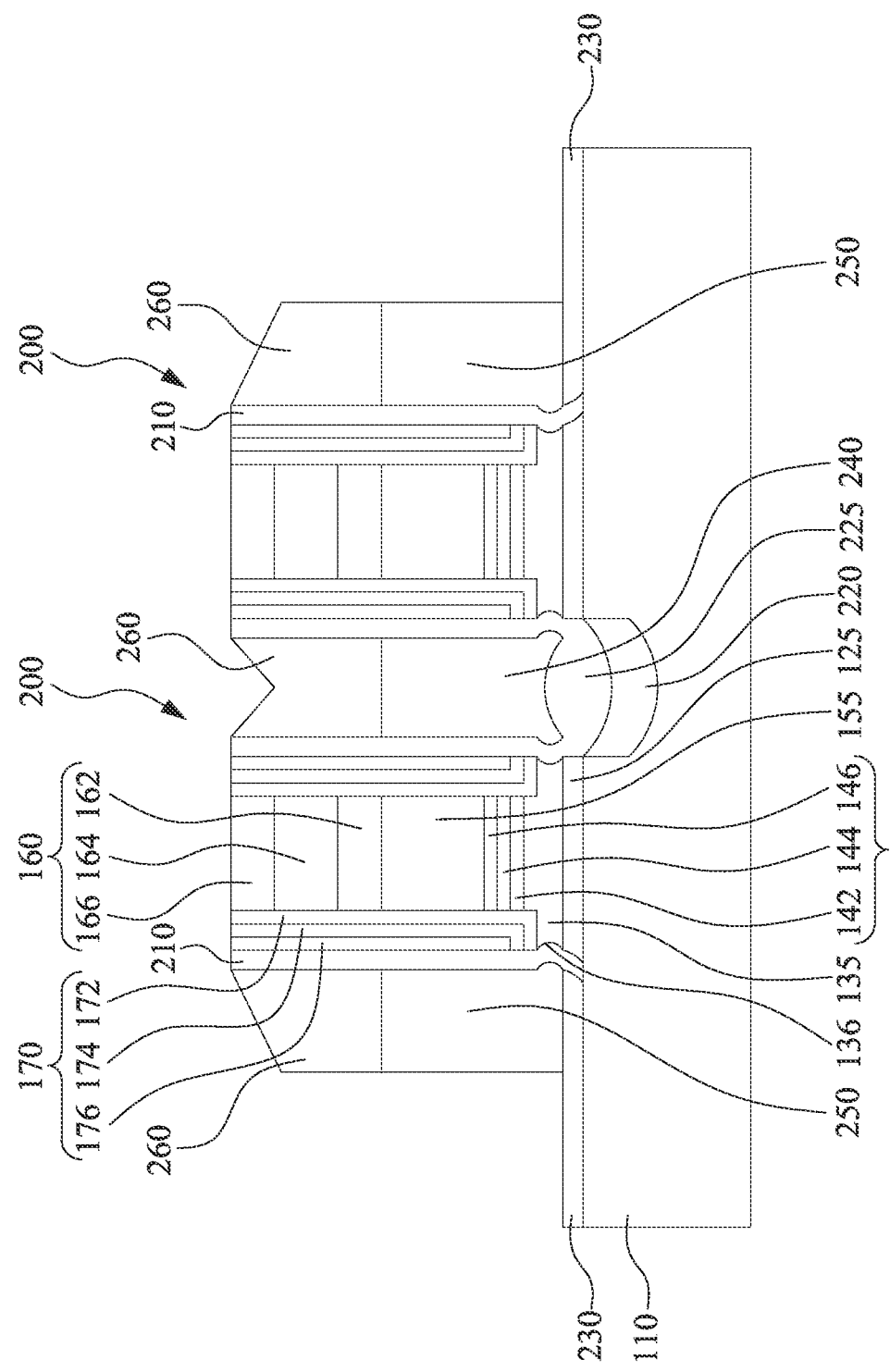

Reference is made to FIG. 10. A plurality of hard masks 260 are respectively formed over the patterned conductive layer, and another etching process is formed to pattern the patterned conductive layer using the hard masks 260 as masks to form the erase gates 240 and select gates 250.

Figure 11:
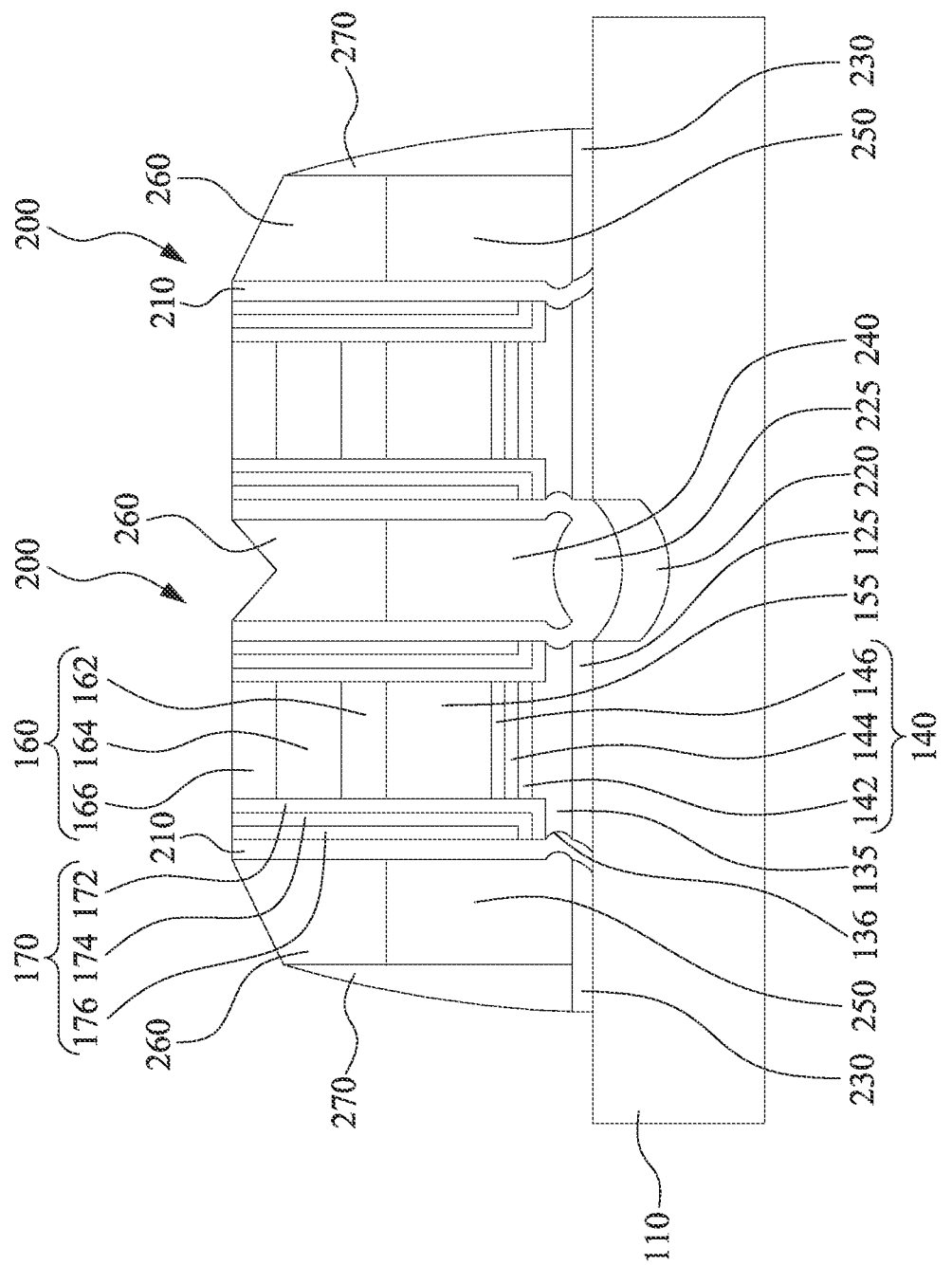

Reference is made to FIG. 11. A plurality of word-line spacer structures 270 are formed on sidewalls of the select gates 250, such that the select gate 250 is between the word-line spacer structure 270 and the gate stack 200. The word-line spacer structures 270 may be formed using a deposition method, such as plasma enhanced chemical vapor deposition (PECVD), low-pressure chemical vapor deposition (LPCVD), sub-atmospheric chemical vapor deposition (SACVD), or the like. The formation of the word-line spacer structures 270 may include blanket forming spacer layers and then performing etching operations to remove the horizontal portions of the spacer layers. The remaining vertical portions of the spacer layers form the word-line spacer structures 270. In some embodiments, portions of the word-line dielectric layers 230 not exposed by the word-line spacer structures 270 are removed as well, such that portions of the substrate 110 are exposed. In some embodiments, the word-line spacer structures 270 may be multiple layers, e.g., oxide-nitride-oxide layers.

Figure 12:
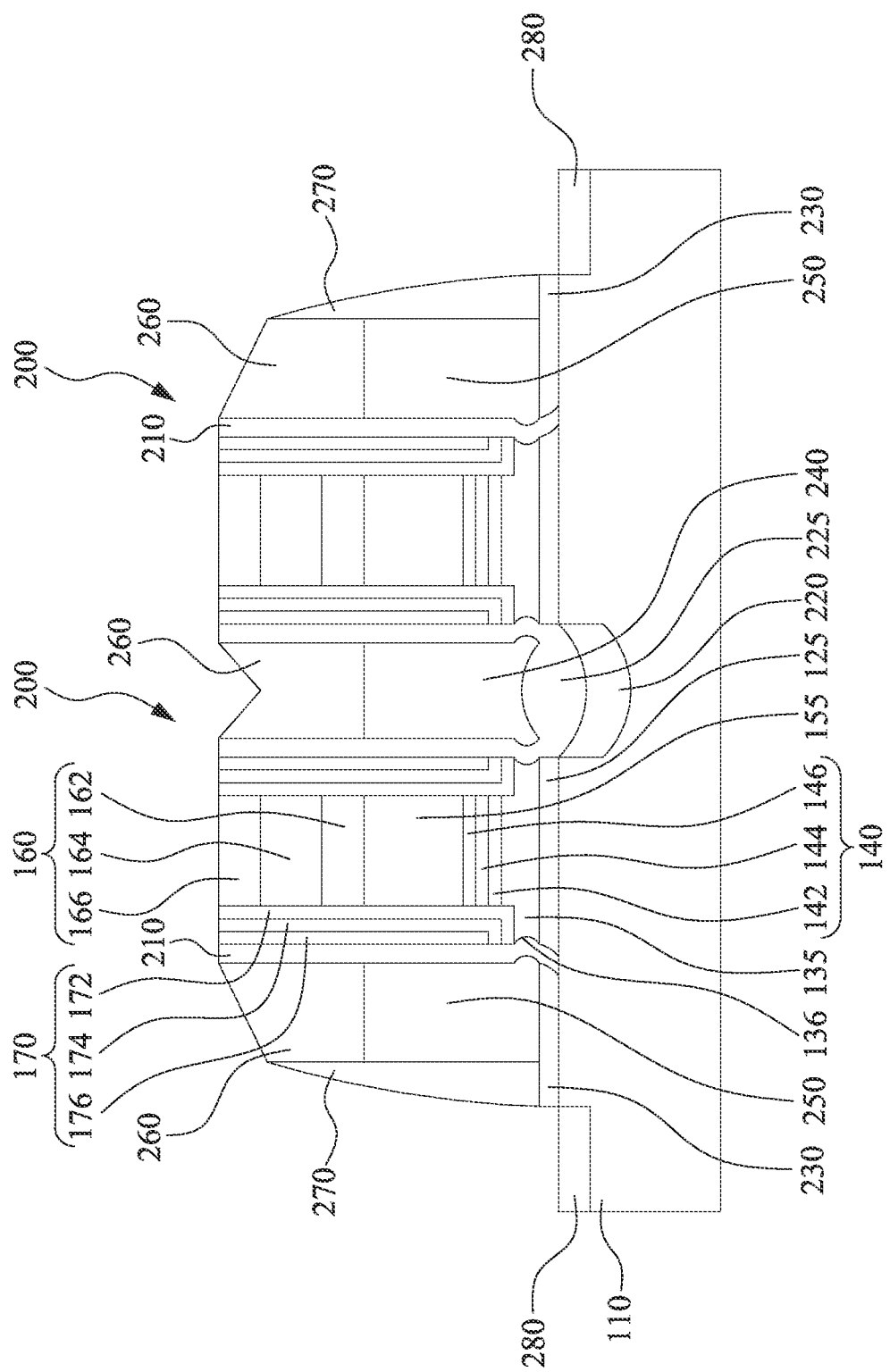

Reference is made to FIG. 12. A plurality of drain regions 280 are formed in the substrate 110. Specifically, the drain regions 280 are respectively disposed adjacent to the word-line spacer structures 270. In other words, the gate stack 200 and the select gate 250 are disposed in a position between the common source region 220 and the drain region 280. In some embodiments, the drain regions 280 are formed by performing an ion implantation process in the substrate 110.

Figure 13:
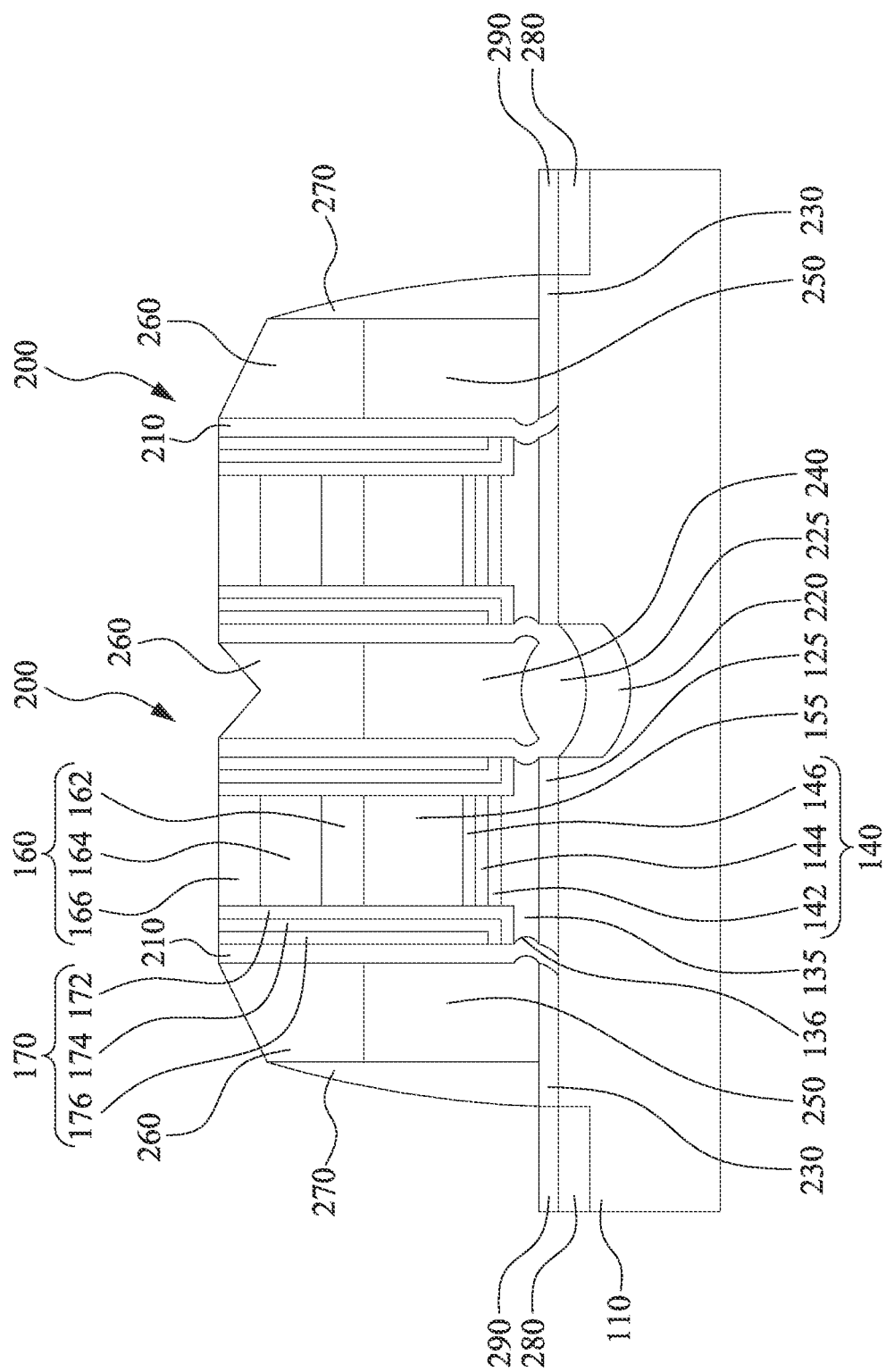

Reference is made to FIG. 13. Metal alloy layers 290 are respectively formed over the drain regions 280 to reduce the contact resistance. For example, a metal layer may be formed over the drain regions 280, and an annealing process is performed on the metal layer to form the metal alloy layers 290. The annealing process is also referred to as a silicide process if the substrate 110 is made of silicon. The silicide process converts the surface portions of the substrate 110 into silicide contacts (i.e., the metal alloy layers 290 in this case). Silicide processing involves deposition of a metal material (i.e., the metal layer mentioned above) that undergoes a silicidation reaction with silicon (Si). In order to form silicide contacts on the drain regions 280, the metal layer is blanket deposited on the substrate 110. After heating the wafer to a temperature at which the metal reacts with the silicon of the substrate 110 to form contacts, unreacted metal is removed. The silicide contacts remain over the drain regions 280, while unreacted metal is removed from other areas.

Figure 14:
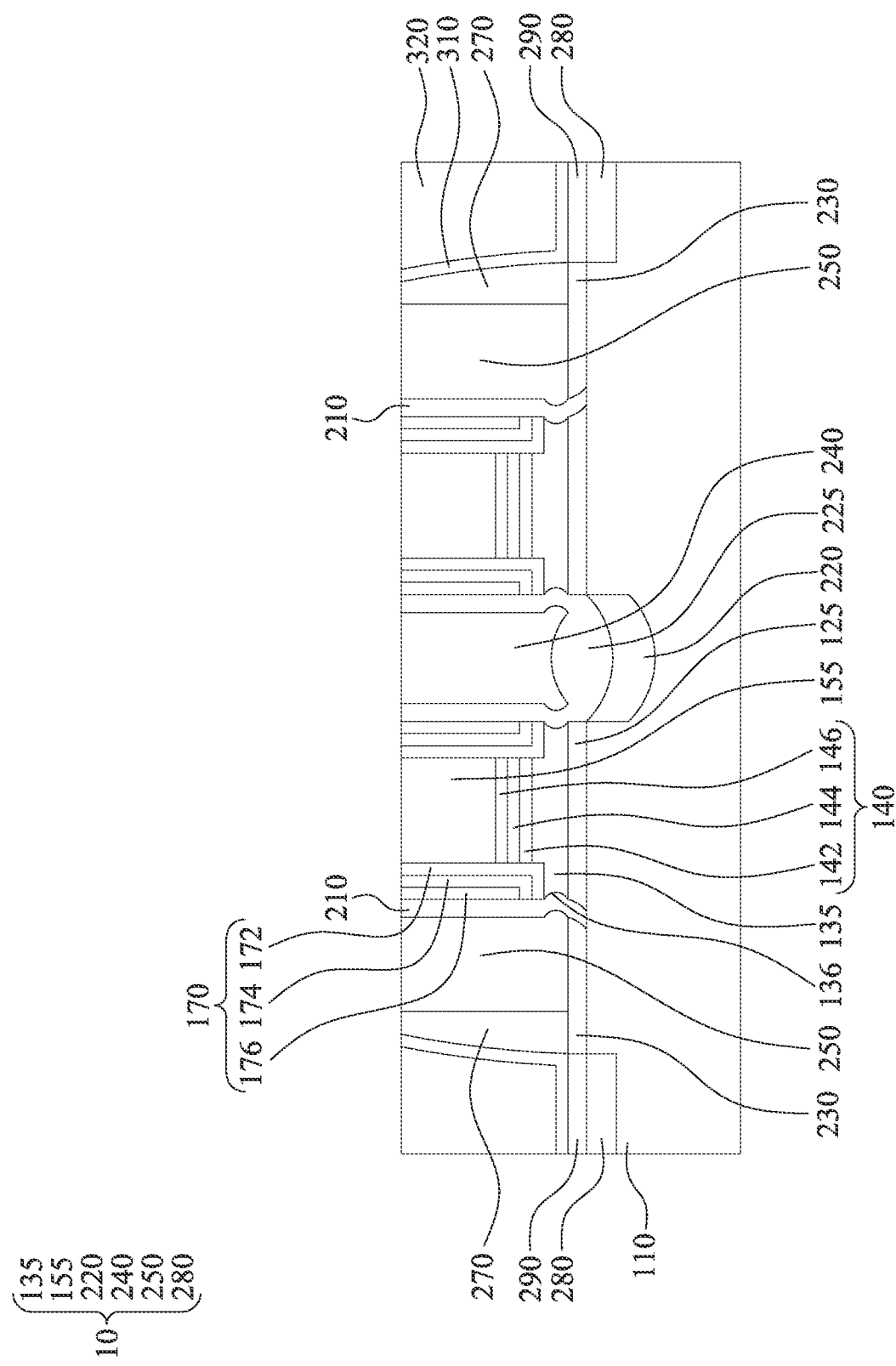

Reference is made to FIG. 14. An etching stop layer 310 is conformally formed over the structure of FIG. 13, and a first interlayer dielectric (ILD) 320 is formed over the etching stop layer 310. In some embodiments, the etching stop layer 310 is a stressed layer or layers. In some embodiments, the etching stop layer 310 has a tensile stress and is formed of $Si_3N_4$. In some other embodiments, the etching stop layer 310 includes materials such as oxynitrides. In yet some other embodiments, the etching stop layer 310 may have a composite structure including a plurality of layers, such as a silicon nitride layer overlying a silicon oxide layer. The etching stop layer 310 may be formed using plasma enhanced CVD (PECVD), however, other suitable methods, such as low pressure CVD (LPCVD), atomic layer deposition (ALD), and the like, can also be used. The first ILD 320 may be formed by chemical vapor deposition (CVD), high-density plasma CVD, spin-on, sputtering, or other suitable methods. In some embodiments, the first ILD 320 includes silicon oxide. In some other embodiments, the first ILD 320 may include silicon oxy-nitride, silicon nitride, or a low-k material.

Then, a chemical mechanical polish (CMP) process is performed to level the top surface of the first ILD 320 with the top surfaces of the erase gates 240, the control gates 155, and the select gates 250. As such, a plurality of memory cells 10 are formed. At least one of the memory cells 10 includes a floating gate 135, a control gate 155, an erase gate 240, a select gate 250, a common source region 220, and a drain region 280. Two adjacent (mirrored) memory cells 10 share one source region 220.

Figure 15:
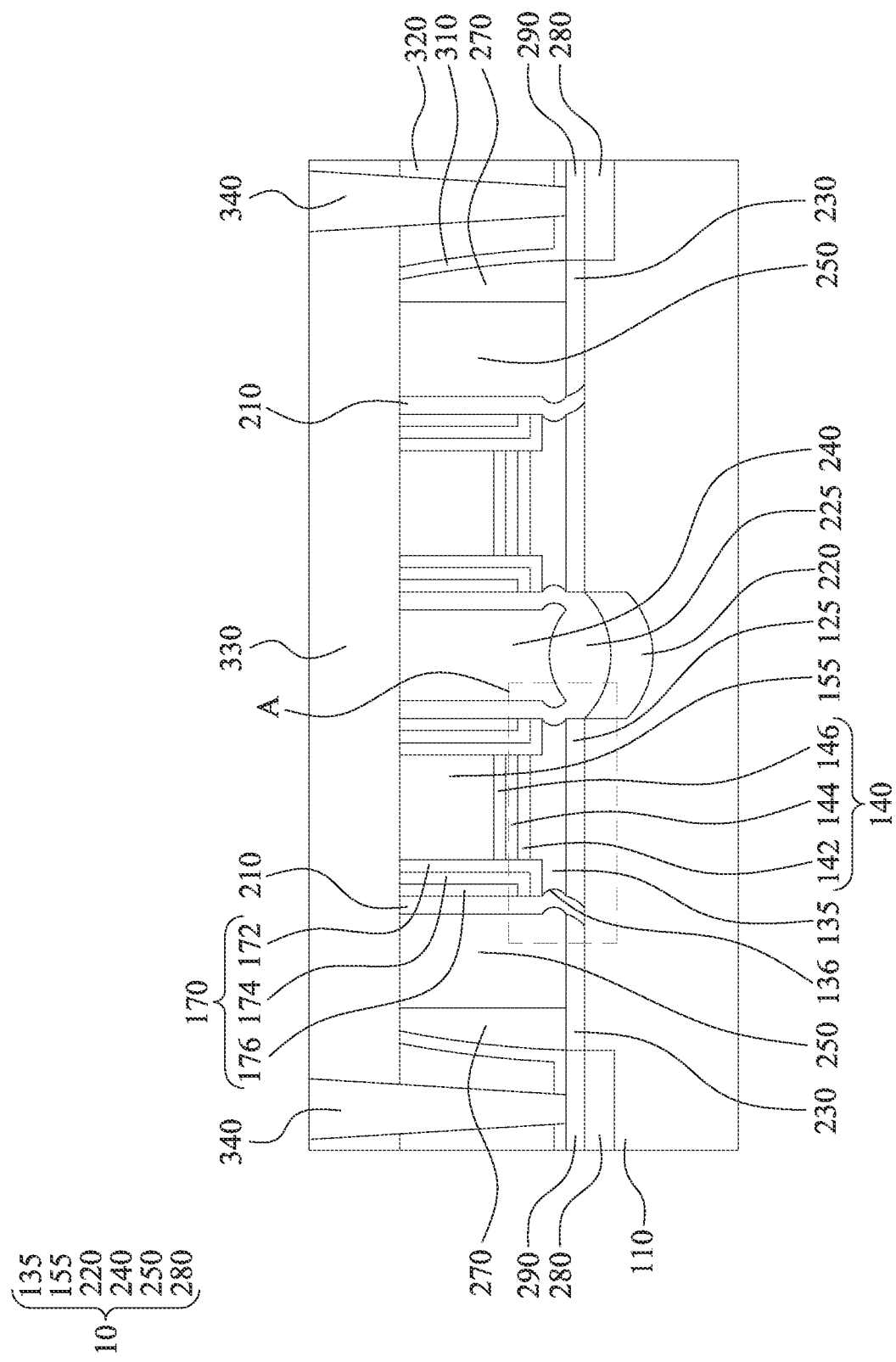

Reference is made to FIG. 15. A second ILD 330 is formed over the first ILD 320. The second ILD 330 may be formed by chemical vapor deposition (CVD), high-density plasma CVD, spin-on, sputtering, or other suitable methods. In some embodiments, the second ILD 330 includes silicon oxide. In some other embodiments, the second ILD 330 may include silicon oxy-nitride, silicon nitride, or a low-k material. Then, a plurality of contacts 340 are formed in the first and second ILDs 320 and 330 and respectively connected to the metal alloy layers 290 (the drain regions 280). For example, a plurality of the openings are formed in the first and second ILDs 320 and 330, and conductive materials are filled in the openings. The excess portions of the conductive materials are removed to form the contacts 340. The contacts 340 may be made of tungsten, aluminum, copper, or other suitable materials.

Figure 16:
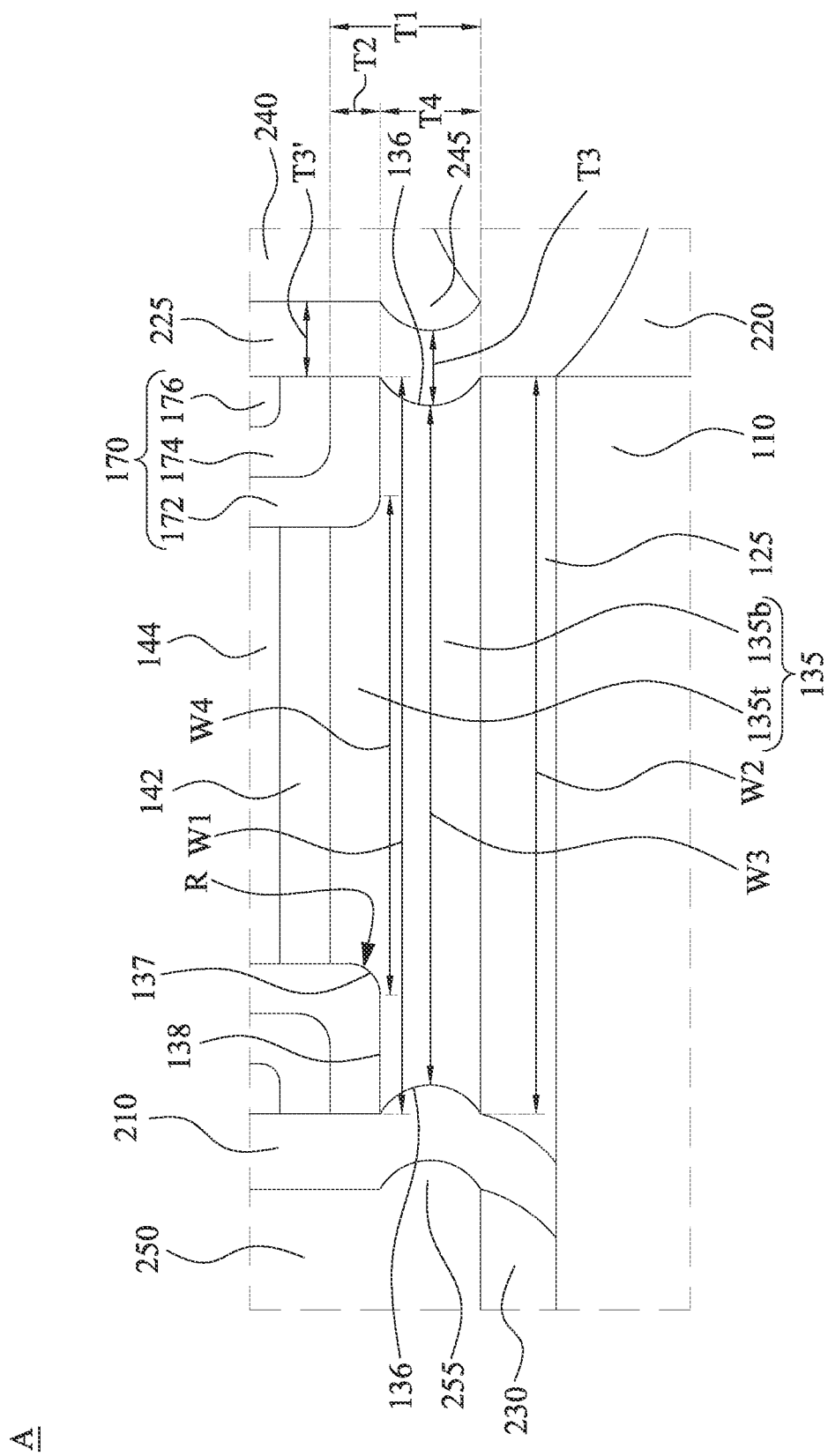
FIG. 16 is an enlarged view of area A in FIG. 15.

Reference is made to FIGS. 15 and 16, where FIG. 16 is an enlarged view of area A in FIG. 15. As mentioned above, the memory cell 10 includes the floating gate 135, the control gate 155, the erase gate 240, the select gate 250, the common source region 220, and the drain region 280. Two adjacent (mirrored) memory cells 10 share one source region 220. The floating gate 135 has a top portion 135t and a bottom potion 135b between the top portion 135t and the gate dielectric layer 125. The control-gate spacer structure 170 is in contact with a sidewall 137 of the top potion 135t and a top surface 138 of the bottom portion 135b. Further, the control-gate spacer structure 170 is spaced apart from the sidewall 136 of the bottom portion 135b. Specifically, the top portion 135t is sandwiched between the control-gate spacer structures 170, and the bottom portion 135b is under the control-gate spacer structures 170. The control-gate spacer structures 170 on opposite sides of the top portion 135t have substantially symmetric profile. The sidewall 137 of the top portion 135t and the sidewall 136 of the bottom portion 135b are not coterminous. In some embodiments, the floating gate 135 has a recess R, and the control-gate spacer structure 170 is partially deposited in the recess R.

The sidewalls 136 are curved, e.g., concave. In some embodiments, the bottom portion 135b of the floating gate 135 gets narrower toward the substrate 110. In some other embodiments, the bottom portion 135b of the floating gate 135 gets narrower and then wider toward the substrate 110. The bottom portion 135b has a top width W1 at the interface between the top portion 135t and the bottom potion 135b, a bottom width W2 at the interface between the bottom portion 135b and the gate dielectric layer 125, and a middle width W3 which is the minimum width of the bottom portion 135b. The top width W1 is greater than the middle width W3. For example, the ratio of the top width W1 to the middle width W3 may be greater than about 106%, e.g., in a range between about 106% and about 115%. If the ratio of the top width W1 to the middle width W3 is lower than about 106%, the coupling rate between the erase gate 240 and the floating gate 135 may be low; if the ratio of the top width W1 to the middle width W3 is greater than about 115%, the performance of the floating gate 135 may be lowered.

In some embodiments, the bottom width W2 is greater than the middle width W3. In still some embodiments, the top width W1 is greater than the bottom width W2, and the bottom width W2 is greater than the middle width W3. For example, the ratio of the bottom width W2 to the middle width W3 may be greater than about 103%, e.g., in a range between about 103% and about 108%. If the ratio of the bottom width W2 to the middle width W3 is lower than about 103%, the program speed of the memory device may be slow.

The top portion 135t of the floating gate 135 has a maximum width W4 less than the middle width W2 of the bottom portion 135t of the floating gate 135. The top portion 135t gets wider toward the substrate 110. The sidewalls 137 of the top portion 135t are also curved, but the profile of the sidewall 137 is different from that of the sidewall 136. Further, the floating gate 135 has a thickness T1, and the top portion 135t of the floating gate 135 has a thickness (i.e., the depth T2 shown in FIG. 2). A ratio of the thickness T2 to the thickness T1 (see FIG. 1) of the floating gate layer 130 is in a range between about 900 nm and about 2000 nm. In some embodiments, a thickness T4 of the bottom portion 135b is greater than the thickness T2 of the top portion 135t.

The CS dielectric layer 225 is between the erase gate 240 and the floating gate 135. In some embodiments, the CS dielectric layer 225 is in contact with the erase gate 240 and one of the sidewalls 136. Since the sidewall 136 is concave, a portion of the CS dielectric layer 225 in contact with the sidewall 136 is also curved. In some embodiments, a thickness T3 of the portion of the CS dielectric layer 225 in contact with the sidewall 136 is in a range of about 4900 nm to about 5400 nm. If the thickness T3 is less than about 4900 nm, the retention of the memory device 10 may be reduced. In some embodiments, the thickness T3 of the portion of the CS dielectric layer 225 in contact with the sidewall 136 is substantially the same as the thickness T3' of a portion of the CS dielectric layer 225 in contact with the control-gate spacer structures 170.

The erase gate 240 is in contact with the CS dielectric layer 225, and the erase gate 240 has a convex portion 245 protruding toward the sidewall 136 of the floating gate 135. The floating gate 135 and the erase gate 240 have a coupling ratio therebetween. The coupling ratio affects the erasing speed, that is, the greater the coupling ratio, the faster is the erasing speed. The area (i.e., contact area) of the CS dielectric layer 225 in contact with the floating gate 135 affects the coupling ratio. That is, the larger the contact area, the greater is the coupling ratio. In FIG. 16, since the sidewall 136 of the floating gate 135 is curved (or concave or arc), the contact area between the CS dielectric layer 225 and the floating gate 135 is large, such that the coupling ratio can be increased.

Also, the area (i.e., contact area) of the CS dielectric layer 225 in contact with the erase gate 240 affects the coupling ratio. That is, the larger the contact area, the greater is the coupling ratio. In FIG. 16, since the erase gate 240 has the convex portion 245 protruding toward the CS dielectric layer 225, the contact area between the CS dielectric layer 225 and the erase gate 240 is large, such that the coupling ratio can be increased. With such configuration, in some embodiments, the CS dielectric layer 225 can have the thickness T3 that not too thin just for increasing the coupling ratio. Moreover, in some embodiments, the coupling ratio is increased without increasing the thickness T1 of the floating gate 135.

The floating-gate spacer structure 210 is between the select gate 250 and the floating gate 135. In some embodiments, the floating-gate spacer structure 210 is in contact with the select gate 250 and another one of the sidewalls 136. In some embodiments, the floating-gate spacer structure 210 is a conformal layer. Since the sidewall 136 is concave, a portion of the floating-gate spacer structures 210 in contact with the sidewall 136 is also curved. The select gate 250 is in contact with the floating-gate spacer structure 210, and the select gate 250 has a convex portion 255 protruding toward the sidewall 136 of the floating gate 135. This configuration also improves the coupling between the select gate 250 and the floating gate 135.

The memory device according to some embodiments has three different states it can be in: programming, reading, and erasing. During the program operation, a voltage is applied between the common source region 220 and the drain region 280, with, for example, a drain voltage of about 0.2 V and a source voltage of about 4.3V. The select gate 250 is applied with a voltage of about 0.8V to turn on the channel under the select gate 250. Therefore, a current (hence electrons) flows between the common source region 220 and the drain region 280. A high voltage, for example, about 11V, is applied on the control gate 155, and thus the electrons are programmed into the floating gate 135 under the influence of a high electrical field. Further, another voltage, for example, about 4.3V, is applied on the erase gate 240. During an erase operation, a high voltage, for example, about 13V, is applied to the erase gate 240. The select gate 250 is applied with a low voltage such as about 0V, while the common source region 220, the drain region 280, and the control gate 155 are applied with a voltage of about 0V. Electrons in the floating gate 135 are thus driven into the erase gate 240. During the reading operation, the select gate 250 is applied with a voltage of about 1.3V, the control gate 155 is applied with a voltage of about 1.6, and the erase gate 240 is applied with a voltage of about 1.6V.

Figure 17:
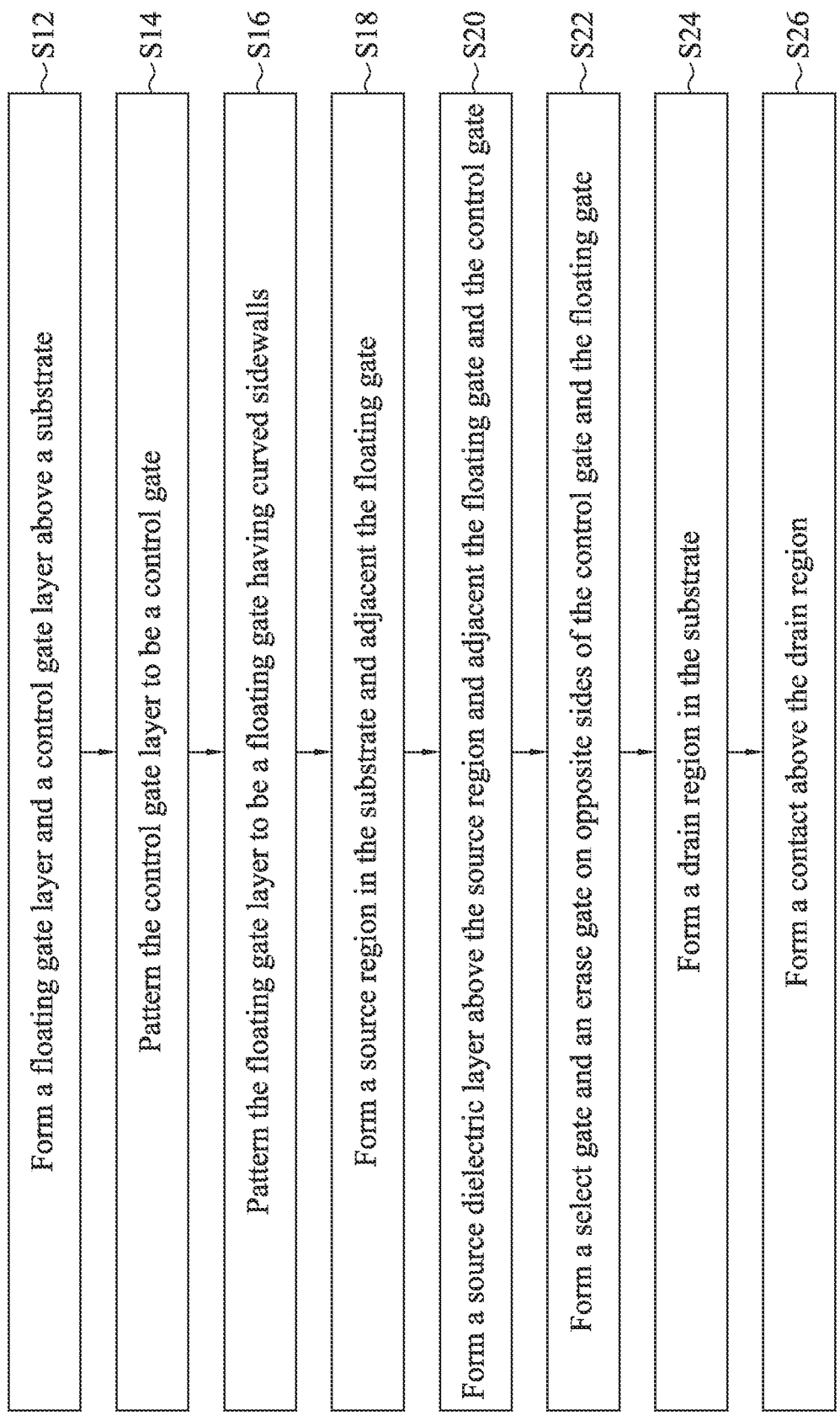
FIG. 17 is a flow chart of a method for forming a memory device in accordance with some embodiments of the present disclosure.

FIG. 17 is a flow chart of a method M1 for forming a memory device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a floating gate layer and a control gate layer are subsequently formed above a substrate. FIG. 1 illustrates a cross-sectional view of some embodiments corresponding to act in block S12. At block S14, the control gate layer is patterned to be a control gate. FIG. 2 illustrates a cross-sectional view of some embodiments corresponding to act in block S14. At block S16, the floating gate layer is patterned to be a floating gate having curved sidewalls. FIG. 4 illustrates a cross-sectional view of some embodiments corresponding to act in block S16. At block S18, a source region is formed in the substrate and adjacent the floating gate. FIG. 7 illustrates a cross-sectional view of some embodiments corresponding to act in block S18. At block S20, a source dielectric layer is formed above the source region and adjacent the floating gate and the control gate. FIG. 8 illustrates a cross-sectional view of some embodiments corresponding to act in block S20. At block S22, a select gate and an erase gate are formed on opposite sides of the control gate and the floating gate. FIGS. 9-10 illustrate cross-sectional views of some embodiments corresponding to act in block S22. At block S24, a drain region is formed in the substrate. FIG. 12 illustrates a cross-sectional view of some embodiments corresponding to act in block S24. At block S26, a contact formed above the drain region. FIG. 15 illustrates a cross-sectional view of some embodiments corresponding to act in block S26.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory circuit has a floating gate with a curved sidewall, and thus the coupling ratio between the floating gate and the erase gate can be improved. Another advantage is that the aforementioned memory devices possess good coupling ratio without thinning the CS dielectric layer and/or increasing the thickness of the floating gate, which may reduce the performance of the memory devices. Furthermore, the floating gate with the curved-sidewall does not complicate the manufacturing process for forming the memory device.

According to some embodiments, a memory device includes a floating gate, a control gate, a spacer structure, a dielectric layer, and an erase gate. The floating gate is above a substrate. The floating gate has a curved sidewall. The control gate is above the floating gate. The spacer structure is in contact with the control gate and the floating gate. The spacer structure is spaced apart from the curved sidewall of the floating gate. The dielectric layer is in contact with the spacer structure and the curved sidewall of the floating gate. The erase gate is above the dielectric layer.

According to some embodiments, a memory device includes a floating gate, a control gate, a spacer structure, a dielectric layer, and a select gate. The floating gate is above a substrate. The floating gate has a curved sidewall. The control gate is above the floating gate. The spacer structure is in contact with the control gate and the floating gate. The dielectric layer is in contact with the spacer structure and the curved sidewall of the floating gate. The select gate is adjacent the dielectric layer.

According to some embodiments, a method for manufacturing a memory device including forming a floating gate layer above a substrate. A control gate layer is formed above the floating gate layer. The control gate layer is patterned to form a control gate above the floating gate layer. A spacer structure is formed on a sidewall of the control gate and above the floating gate layer, such that a sidewall of the floating gate is curved. An erase gate is formed adjacent the sidewall of the floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
sequentially depositing a floating gate layer, a dielectric structure stack, and a control gate layer over a substrate;
performing a first etching process to pattern the control gate layer, the dielectric structure stack, and a top portion of the floating gate layer to form a control gate, a dielectric structure, and a top portion of a floating gate over a bottom portion of the floating gate layer, wherein a sidewall of the top portion of the floating gate is concave;
forming a first spacer structure on the sidewall of the top portion of the floating gate, a sidewall of the dielectric structure, and a sidewall of the control gate; and
after forming the first spacer structure, performing a second etching process to pattern the bottom portion of the floating gate layer to form a bottom portion of the floating gate, wherein a sidewall of the bottom portion of the floating gate is concave.

2. The method of claim 1, wherein the sidewall of the top portion of the floating gate and the sidewall of the bottom portion of the floating gate have different curvatures.

3. The method of claim 1, wherein the second etching process is performed by using an etching gas comprising $CH_xF_y$.

4. The method of claim 1, wherein the floating gate layer comprises polysilicon, metal, metal alloys, single crystalline silicon, or combinations thereof.

5. The method of claim 1, further comprising forming a second spacer structure on a sidewall of the first spacer structure and the sidewall of the bottom portion of the floating gate.

6. The method of claim 5, wherein the second spacer structure is separated from the sidewall of the top portion of the floating gate by the first spacer structure.

7. The method of claim 1, further comprising forming an erase gate over the substrate and adjacent to the control gate.

8. A method, comprising:
forming a floating gate over a substrate;
forming a control gate over the floating gate; and
forming an erase gate and a select gate on opposite sides of the control gate, wherein the floating gate gets wider and then gets narrower in a direction from the control gate toward the substrate, wherein the floating gate has a bottom portion and a top portion over the bottom portion, the top portion having a narrower width than the bottom portion and a curved sidewall, and the bottom portion having a concave sidewall that is horizontally displaced from the curved sidewall of the top portion.

9. The method of claim 8, wherein the floating gate has a maximum width at a bottom surface of the floating gate.

10. The method of claim 8, wherein the floating gate has a minimum width at a top surface of the floating gate.

11. The method of claim 8, further comprising:
forming a spacer structure in contact with the control gate and the floating gate.

12. The method of claim 11, wherein a bottom surface of the spacer structure is lower than a top surface of the floating gate and higher than a bottom surface of the floating gate.

13. The method of claim 8, further comprising:
forming a gate dielectric layer between the floating gate and the substrate.

14. The method of claim 13, wherein the gate dielectric layer is wider than the floating gate.

15. A method, comprising:
forming a floating gate over a substrate;
forming a control gate over the floating gate; and
forming first spacer structures on opposite sides of the control gate, wherein a top portion of the floating gate is sandwiched between the first spacer structures, and the top portion of the floating gate gets narrower toward the control gate, wherein the top portion of the floating gate forms curved interfaces with the first spacer structures, the first spacer structures are directly over a bottom portion of the floating gate, and the bottom portion of the floating gate has opposite concave sidewalls.

16. The method of claim 15, further comprising:
forming a gate dielectric layer between the floating gate and the substrate.

17. The method of claim 16, wherein a fourth sidewall of the gate dielectric layer is concave.

18. The method of claim 15, further comprising:
forming a select gate over the substrate and adjacent to the floating gate.

19. The method of claim 15, the control gate has a top surface substantially level with a top surface of one of the first spacer structures.

20. The method of claim 15, wherein the floating gate has a topmost width and a bottommost width different from the topmost width.

* * * * *